(12) United States Patent
Jobert

(10) Patent No.: US 8,829,501 B2
(45) Date of Patent: Sep. 9, 2014

(54) LARGE AREA LIGHT EMITTING DEVICE COMPRISING ORGANIC LIGHT EMITTING DIODES

(75) Inventor: Pierre Paul Jobert, Voiron (FR)

(73) Assignee: Novaled AG, Dresden (DE)

( * ) Notice: Subject to any disclaimer, the term of this patent is extended or adjusted under 35 U.S.C. 154(b) by 282 days.

(21) Appl. No.: 13/510,033

(22) PCT Filed: Dec. 14, 2010

(86) PCT No.: PCT/EP2010/069626
§ 371 (c)(1),
(2), (4) Date: Oct. 31, 2012

(87) PCT Pub. No.: WO2011/073189
PCT Pub. Date: Jun. 23, 2011

(65) Prior Publication Data
US 2013/0193871 A1 Aug. 1, 2013

(30) Foreign Application Priority Data
Dec. 18, 2009 (EP) .................................... 09015704

(51) Int. Cl.
*H01L 29/08* (2006.01)
*H01L 51/00* (2006.01)
*H01L 33/62* (2010.01)
*H05B 33/08* (2006.01)
*H01L 27/32* (2006.01)
*H01L 51/52* (2006.01)

(52) U.S. Cl.
CPC ........ *H01L 51/5203* (2013.01); *H01L 51/0096* (2013.01); *H01L 33/62* (2013.01); *H05B 33/0842* (2013.01); *H01L 27/3202* (2013.01); *H01L 51/5237* (2013.01); *H01L 2251/5361* (2013.01); *H01L 27/3204* (2013.01); *H01L 51/0059* (2013.01); *H01L 2251/5315* (2013.01); *Y02E 10/549* (2013.01); *H01L 2924/0002* (2013.01)
USPC ..................................... 257/40; 257/E51.019

(58) Field of Classification Search
CPC ........................ H01L 27/3288; H01L 27/3276
USPC ............................................ 257/40, E51.019
See application file for complete search history.

(56) References Cited

U.S. PATENT DOCUMENTS 4,539,507 A 9/1985 VanSlyke et al.
5,247,190 A 9/1993 Friend et al.
(Continued)

FOREIGN PATENT DOCUMENTS

| JP | 2006-228456 A | 8/2006 |
|---|---|---|
| WO | 90/13148 A1 | 11/1990 |
| WO | 98/53644 A1 | 11/1998 |

OTHER PUBLICATIONS

European Examination Report for EP Application No. 10 798 038.5 mailed Jan. 30, 2014 (4 pages).

(Continued)

*Primary Examiner* — Lex Malsawma
*Assistant Examiner* — Patricia Reddington
(74) *Attorney, Agent, or Firm* — Sutherland Asbill & Brennan LLP

(57) ABSTRACT

The invention relates to an organic light emitting device having an electrode, a counter electrode, at least one light emitting region that includes a stack of organic layers between the electrode and the counter electrode, which stack of organic layers is provided between a metal substrate and a transparent encapsulation, a current supply layer, electrically connected to the electrode or the counter-electrode, the current supply layer being partially provided overlapping an electric insulating layer provided in direct contact with the metal substrate, and at least one electrical feedthrough through the metal substrate and through the electric insulating layer, which electrical feedthrough provides an electrical connection to the current supply layer and is electrically isolated from the metal substrate.

15 Claims, 6 Drawing Sheets

(56) References Cited

U.S. PATENT DOCUMENTS

| | | |
|---|---|---|
| 7,274,141 B2 | 9/2007 | Leo et al. |
| 8,395,319 B2 * | 3/2013 | Tchakarov et al. ........... 313/512 |
| 2004/0062949 A1 | 4/2004 | Pfeiffer et al. |
| 2004/0251816 A1 | 12/2004 | Leo et al. |
| 2005/0110009 A1 | 5/2005 | Blochwitz-Nimoth et al. |
| 2006/0087224 A1 * | 4/2006 | Oki et al. ...................... 313/504 |
| 2006/0250076 A1 | 11/2006 | Hofmann et al. |
| 2007/0051946 A1 | 3/2007 | Walzer et al. |
| 2008/0010876 A1 * | 1/2008 | Sung et al. ...................... 40/541 |
| 2009/0045728 A1 | 2/2009 | Murano et al. |
| 2010/0117523 A1 | 5/2010 | Tchakarov |
| 2013/0207094 A1 * | 8/2013 | Tchakarov ...................... 257/40 |

OTHER PUBLICATIONS

International Search Report for PCT Application No. PCT/EP2010/069626 mailed Jun. 14, 2011 (3 pages).

* cited by examiner

LARGE AREA LIGHT EMITTING DEVICE COMPRISING ORGANIC LIGHT EMITTING DIODES

CROSS-REFERENCE TO RELATED APPLICATIONS

This is a submission pursuant to 35 U.S.C. 154(d)(4) to enter the national stage under 35 U.S.C. 371 for PCT/EP2010/069626, filed Dec. 14, 2010. Priority is claimed under 35 U.S.C. 119(a) and 35 U.S.C. 365(b) to European Patent Application Number 09 015 704.1, filed Dec. 18, 2009. The subject matters of international application no. PCT/EP2010/069626 and European Patent Application No. 09 015 704.1 are expressly incorporated herein by reference.

FIELD OF THE INVENTION

The invention relates to a light emitting device, in particular a top emitting organic light-emitting diode (OLED) fabricated on a metal substrate.

BACKGROUND OF THE INVENTION

Organic light-emitting diodes have undergone a very rapid development in recent years. In particular, efficiencies of more than 100 lumen/W were successfully obtained for white-emitting light-emitting diodes. As also the lifetime of these systems has grown very quickly and, in the meantime, values of 10,000 hours for some material systems have even been significantly exceeded; organic light-emitting diodes also appear interesting for applications in lighting systems. The essential advantages of the organic light-emitting diodes are the high efficiency, the possibility of realizing very thin, large area, surface lighting units.

The conventional structural arrangement of organic light emitting diodes comprises a transparent substrate, in most cases glass, which is coated with a transparent anode that is frequently formed from indium tin oxide (ITO). Active organic layers and a metallic cathode are subsequently deposited over the anode. If some volts are applied between the metallic cathode and the transparent anode, the light-emitting diode emits the light through the substrate (bottom emission). Another variation is the top emitting OLED, in which the top electrode (anode or cathode) is transparent. Top emitting OLEDs can be constructed under a variety of substrates, for example metal substrates, Si-wafers, display backplanes, printed circuit boards (PCB), or even transparent substrates coated with a reflective layer, which reflective layer can be the bottom electrode itself. Exemplary documents concerning OLEDs are U.S. Pat. No. 4,539,507, WO90/13148, US20040062949, US20040251816, and US2007051946.

OLEDs on metal substrate have also been proposed. These OLEDs are so called top-emitting, because the light is transmitted trough the top electrode and not trough the substrate.

Several different approaches have been formulated to create large area, homogeneous OLED lighting devices. The main problem is the current distribution across the surface. Usually the electrodes of the OLED are also the current supply layers (electrical bus), or an extra conductive layer is deposited over the electrode, which has to be thin if transparency is required. For large areas, the resistance of these thin conductive layers is too high, since the current required for a large area OLED is very high. The resistance is the cause of the strong inhomogeneity in light emission and the device degradation.

Some approaches for homogeneity correction is the use of additional current supply lines, for example a metal grid deposited in connection to both electrodes. This grid lowers the resistance, but also slightly decreases the active area since it is not transparent. The metal grid also has a limited thickness, limiting again the maximum current that can be supplied to the OLED without loosing homogeneity. For higher currents, a denser grid is necessary, which decreases the efficiency of the whole device. Sometimes a grid is also not desired, because it again depreciates the homogeneity.

Another source of efficiency loss is the power lost by the electrical supply connections. The electrical connections are formed on the substrate and provide an electrical connection outside of the encapsulating region to the electrode itself, which is inside the encapsulated region. The distance of this thin film electrical connection is several cm, or several mm, in the best cases. The film can be larger, but not much thicker, because thicker layers would be not practical to deposit and would cause problem on the encapsulation.

The state of art electrical connections cause not only a big loss in power transmission to the OLED; their resistance and the large current cause considerable heating of the substrate, which does further depreciate the operational lifetime of the device.

SUMMARY OF THE INVENTION

The present invention provides a solution to the problems of the state of art.

The invention is a light emitting device comprising at least one OLED, preferably several OLEDs. Each OLED comprises a stack of organic layers between an electrode and a counter electrode, the overlapping area of the stack of organic layer with the electrode and the counter-electrode defines a light emitting region. The light emitting device comprises a metal substrate on which the OLEDs are formed, optionally the bottom electrode of at least one OLED is the metal substrate itself. All the light emitting regions are encapsulated between the metal substrate and the encapsulation. At least part of the electrical connections is made trough the metal substrate by using electrical feedthroughs which are electrically insulated from the substrate.

The solution is provided by an organic light emitting device comprising at least one light emitting region, wherein each light emitting region comprises a stack of organic layers between an electrode and a counter electrode, which stack of organic layers is provided between a metal substrate and a transparent encapsulation; and wherein a current supply layer, electrically connected to the electrode or the counter-electrode, is partially provided overlapping an electric insulating layer, which electric insulating layer is provided in direct contact with the metal substrate; characterized in that the light emitting device comprises at least one electrical feedthrough through the metal substrate and through the electric insulating layer, which electrical feedthrough provides an electrical connection to the current supply layer and is electrically isolated from the metal substrate.

DESCRIPTION OF THE FIGURES

Following the invention will be described in further detail, by way of example, with reference to different embodiments. In the figures show.

DETAILED DESCRIPTION

Figure 1:
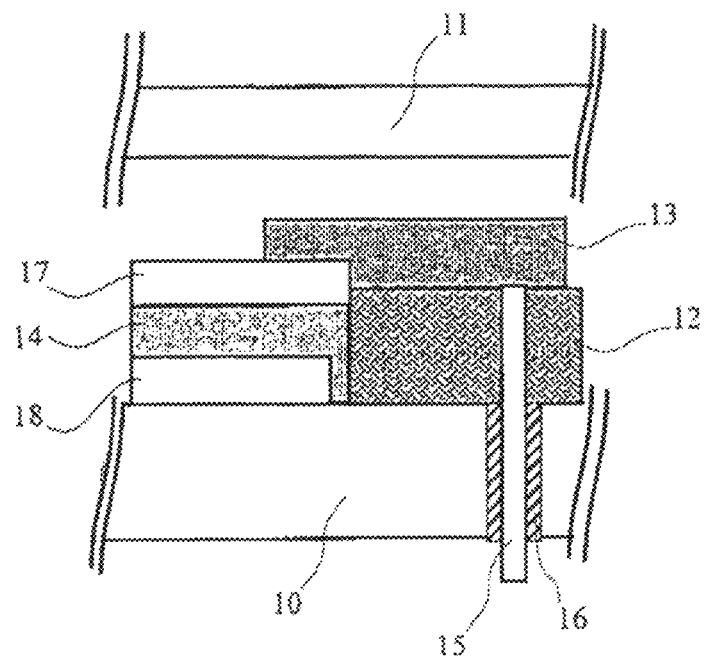
FIG. 1 a cross sectional view of an organic light emitting device comprising the bottom electrode in electrical contact to the metal substrate and the top electrode in contact to the current supply layer, FIG. 2 a cross sectional view of an organic light emitting device where the bottom electrode of the light emitting region is completely electrically isolated from the substrate and in electrically connection to the current supply layer, FIG. 3 a cross sectional view of an organic light emitting device where the top electrode is electrically connected to the current supply layer, FIG. 4 a cross sectional view of an organic light emitting device where the top electrode is electrically connected to the current supply layer and the bottom electrode is formed by the metal substrate, FIG. 5 a cross sectional view of an organic light emitting device where the top electrode is formed by the current supply layer and the bottom electrode is a conductive layer in electrical contact to the metal substrate, FIG. 6 a cross sectional view of an organic light emitting device comprising two electrical feedthroughs, a first electrical feedthrough electrically connected to the bottom electrode and a second electrical feedthrough electrically connected to the top electrode, FIG. 7 a cross sectional view of an electrical feedthrough having a "blind connection" to the current supply layer, FIG. 8 a cross sectional view of an electrical feedthrough having a larger head which head provides the mechanical connection to the substrate and the electrical connection to the current supply layer. In this embodiment the current supply layer is formed over the feedthrough's head, FIG. 9 a cross sectional view of an electrical feedthrough having a larger head which head provides the mechanical connection to the substrate and the electrical connection to the current supply layer. In this embodiment the current supply layer is formed under the feedthrough's head, FIG. 10 a cross sectional view of an electrical feedthrough having an electrical insulation around it; the electrical insulation of the feedthrough goes beyond the interface with the metal substrate, FIG. 11 a cross sectional view of an electrical feedthrough having an electrical insulation around it; the electrical insulation also insulates the external head from the metal substrate (the head is not inside the encapsulated layer), FIG. 12 a cross sectional view of a feedthrough for mechanical support; the feedthrough being electrically insulated from the metal substrate, from the current supply layer, and from both electrodes of the at least one light emitting region, FIG. 13 a cross sectional view of an electrical feedthrough providing mechanical connection via 2 heads, one on the encapsulated region and one head on the opposite side of a rigid board, wherein the rigid board and the metal substrate are separated by a mechanical spacer, and the electrical feedthrough also provides electrical connection between the rigid board (e.g. PCB) and the current supply layer, and FIG. 14 a top view of an organic light emitting device comprising 3 in series connected light emitting regions.

If an encapsulation cover is glued or bonded to the substrate, it is preferred that only two type of materials form the interface encapsulation/substrate, optionally with a glue in between. This is an especial advantage, since it is difficult to find a glue which compatible with more than two different materials (e.g. glass and metal, or glass and polymer). The same is true for direct bonding (e.g. laser welding), the material of the encapsulation must be compatible with the material of (or on) the substrate. Therefore, no only one type of material of or on the substrate should be in contact with the encapsulation. No additional electrical connections should be provided between the encapsulation and the material of the substrate which contact the encapsulation.

In a preferred embodiment, the organic light emitting device comprises several light emitting regions, each one of the several light emitting regions comprises a stack of organic layers, wherein at least two of the several light emitting regions are electrically connected in parallel, wherein the overlapping area of the electrode and the counter-electrode defines an active light emitting region.

In another preferred embodiment, the organic light emitting device comprises a light emitting region, preferably several (a plurality) of light emitting regions, wherein the light emitting region comprises a first dimension of at least 5 mm and a second dimension of at least 50 mm, which second dimension and first dimensions are geometrically orthogonal; this means that the light emitting regions are elongated, for example having a parallelogram or a rectangle shape.

Preferentially the light emitting region has a convex geometric shape. More preferentially a parallelogram shape. Optionally the shape has curved edges. The term dimension refers to a line which can be drawn within the light emitting region.

In another preferred embodiment, the organic light emitting device comprises several light emitting regions, wherein at least two, preferentially 3, neighbouring light emitting regions of the several light emitting regions (OLEDs) are electrically connected in series forming a set of series connected light emitting regions. A higher voltage and a lower current can be used to drive the set due to the series connection; in this case the resistive power loss due to the electrical connections is smaller.

The series connection have the advantages described above, but if too many individual OLEDs are connected in series, the driving voltage eventually becomes very high, which cause complexity in the driving electronics and also safety concerns. Furthermore, if one of the several light emitting regions of a set of series connected light emitting regions fails, the whole set will fail. Therefore it is more effective to have sets of 2, preferentially 3, or more light emitting regions connected in series in a set. A preferred upper limit of light emitting regions in a set is 20, more preferred 5.

In a preferred mode, the organic light emitting device comprises a first set of series connected light emitting region and a second set of series connected light emitting region, wherein the first and the second set of series connected light emitting region are connected in parallel. The sets can be electrically connected in parallel to each other in case the device requires a very large area (therefore a plurality of sets).

A "set" as used in this document is defined as a series connection of connected light emitting regions.

In the preferred configuration, the electrical feedthroughs provide the electrical connection at the extremities of the series connection of each set. The series connection is provided by a bottom electrode (of a first light emitting region) to top electrode (of a second light emitting region) connection via a conductive layer, which optionally is the extension of the layer forming the bottom and/or top electrode.

The organic light emitting device preferentially comprises at least two light emitting regions, more preferentially at least 3 light emitting regions.

The electrical feedthrough, which is at least one, is a conductive connection made through the metal substrate. This electrical feedthrough is preferentially a separate mechanical and electrical (electromechanical) component which is applied to a hole in substrate by mechanical force.

The at least one electrical feedthrough is preferentially chosen from the following list: screw, eyelet rivet, turret, threaded turret, rivet, and button rivet.

The electrical feedthrough is electrically insulated from the substrate, the insulation can be part of the component used for the connection or it can be mounted separately on the substrate.

It is preferred that the part of the electrical feedthrough which is between the substrate and the encapsulation has a height (dimension which is orthogonal to the substrate surface) smaller than 1.5 mm, more preferentially smaller than 500 μm.

The diameter of the hole in the substrate used for the electrical feedthrough is preferentially smaller than 5 mm. The diameter is preferentially smaller than 2 mm if the electrical feedthrough is used only for the electrical connection. The diameter is preferentially between 5 mm and 2 mm if the electrical feedthrough also provides a mechanical connection.

If not provided by the electrical feedthrough, an electrical insulation between the electrical feedthrough and the metal substrate is necessary to provide electrical connection to at least one of the top or bottom electrodes.

If not provided by the electrical feedthrough, a gas barrier is necessary, to seal any possible openings between the encapsulated region and the outside. This sealing is necessary, e.g., if the electrical feedthrough is placed on a through hole, but does not fully seals the hole.

The electrical insulation can be provided by the same material used for electrically insulating the substrate's surface.

Preferably several electrical feedthroughs are employed. A more dense use of the electrical feedthroughs decreases the power loss due to series resistance of the supply conductors, since the feedthroughs can be made thicker than the thin film connections on a surface of the metal substrate. A too dense use of electrical feedthroughs has however drawbacks, it could increase the chance of gas leakages in the encapsulated region, oxygen and moisture would then shorten the device's lifetime. A too dense use of electrical feedthroughs also increases material consumption and processing time.

Preferably the organic light emitting device comprises several electrical feedthroughs essentially aligned in parallel to at least one of the borders of the at least one light emitting region, wherein the several electrical feedthroughs are spaced apart by at least 5 mm.

Preferably the organic light emitting device comprises several electrical feedthroughs essentially aligned in parallel to at least one of the borders of the at least one light emitting region, wherein the several electrical feedthroughs are spaced apart by not more than 50 mm.

In an advanced mode of the invention, the at least one electrical feedthrough also provides a mechanical connection (mechanical support) between the metal substrate and another, essentially rigid board.

Preferably, the essentially rigid board is a PCB (printed circuit board).

In an advanced mode, the mechanical connection between the metal substrate and the PCB is provided by at least a first electrical feedthrough and at second electrical feedthrough. Preferably at least four electrical feedthroughs are used, which provide mechanical connections between the metal substrate and the PCB and also provide electrical connection between the PCB and the OLEDs (light emitting regions). The elongations of the rivets are preferentially fixed to the PCB by soldering or welding, more preferentially by laser soldering or laser welding.

Optionally, some mechanical connection between the substrate and the PCB can be made, which mechanical connection is electrically isolated, as an auxiliary mechanical support.

Optionally, the auxiliary mechanical support can be made of the same components used for the electrical feedthrough.

Optionally, the auxiliary mechanical support can provide an electrical connection between the PCB and the metal substrate, meaning that the auxiliary mechanical support is not electrically insulated from the metal substrate.

Preferentially, the advanced embodiment with a PCB comprises an electronic driver circuit which provides the electrical power for the organic light emitting device. The electronic driver circuit comprises a stage (side) with higher voltage and lower current and a stage (side) with lower voltage and higher current. The stage with the higher voltage can be electrically connected to a power line. The stage with lower voltage provides the power for the OLED.

Preferentially, the side with lower voltage and higher current is electrically connected to the at least one electrical feedthrough.

Optionally, at least one electrical feedthrough is provided completely outside of the encapsulated region, this option is also valid for all the embodiments explained with the figures. In this case the at least one electrical feedthrough does not need an insulation to avoid gas exchange between the two sides of the metal substrate. The one electrical feedthrough can even be hollow.

Preferentially, the at least one electrical feedthrough is provided with one side in the encapsulated region, meaning that it provides an electrical connection from the outside to the encapsulated region through the metal substrate.

The light emitting regions can also be called light emitting areas, the electrically and optically active area of the organic layers are defined by its intersection (overlapping) with the two electrodes, the anode and the cathode.

The bottom side is the region between the light emitting layer of the stack of organic layers (not including the light emitting layer itself) and the metal substrate (including the metal substrate). The top side is the region between the light emitting layer of the stack of organic layers (not including the light emitting layer itself) and the encapsulation.

The bottom electrode is the electrode between the stack of organic layers and the metal substrate of the metal substrate itself.

The top electrode is the electrode between the stack of organic layers and the encapsulation. The top electrode is transparent at least for the main wavelength region emitted by the OLED.

The terms electrode and counter electrode are used to distinguish both electrodes. The electrode can be a top or bottom electrode, the counter electrode is the bottom or the top electrode, respectively.

As a stack of organic layers, it is preferably to use layers of small molecule organic semiconducting materials, e.g. as described in US2006250076. However polymers, or small-molecules/polymers hybrid layers, or other layers can be used.

A stack of organic layers: organic semiconducting and emitter layer, or stack of organic semiconducting layers comprising at least one emitting layer. It is a layer comprising at least one organic semiconducting layer. The stack of organic layers comprises at least one emitting layer. Typically the stack comprises several organic layers, see, for example the OLED description and examples in paragraphs [0005] ("prinzipielle Aufbau"), [0023] ("Vorteilhafte Ausführung"), and [0037] ("bevorzugtes Ausführungsbeispiel") of EP 1 336 208

B1; see also U.S. 2009/0,045,728, especially the paragraph [0078]-[0085] ("A light emitting device comprises m electroluminescent units") and examples 1 to 7 therein. The stack of organic layers can also be polymeric or hybrid, non limiting examples are described in U.S. 2005/0,110,009 A1, especially in paragraphs [0004-0009] ("organic light-emitting diodes in the form of PLEDs"), and [0017-0025] ("p-i-n heterostructure"). Examples of top emitting OLEDs can be found in U.S. Pat. No. 7,274,141, especially the advantageous embodiment in column 4, where the blocking layers are optional, that embodiment can also be of non-inverted type (cathode closer to the substrate than the anode). Although these cited documents do not necessarily describe top emitting OLEDs, they describe the stack of organic layers, which stack can be applied to the electrodes described herein.

All figures are not in scale. FIGS. 1 to 6 only show a cut-section of the device, the device preferentially comprises more than one light emitting region.

FIG. 1 shows a cross sectional view of an organic light emitting device comprising the bottom electrode 18 in electrical contact to the metal substrate 10 and the top electrode 17 in contact to the current supply layer 13. The light emitting region is defined by the overlap of bottom electrode 18 and top electrode 17. The borders of the device are completely sealed by the metal substrate 10 and the encapsulation 11. The encapsulation 11 can be an encapsulating layer or multi-layer such as a thin film encapsulation. The encapsulation 11 can also be a rigid encapsulation, such as an encapsulation cover glass. The rigid encapsulation preferentially comprises a getter material.

Figure 4:
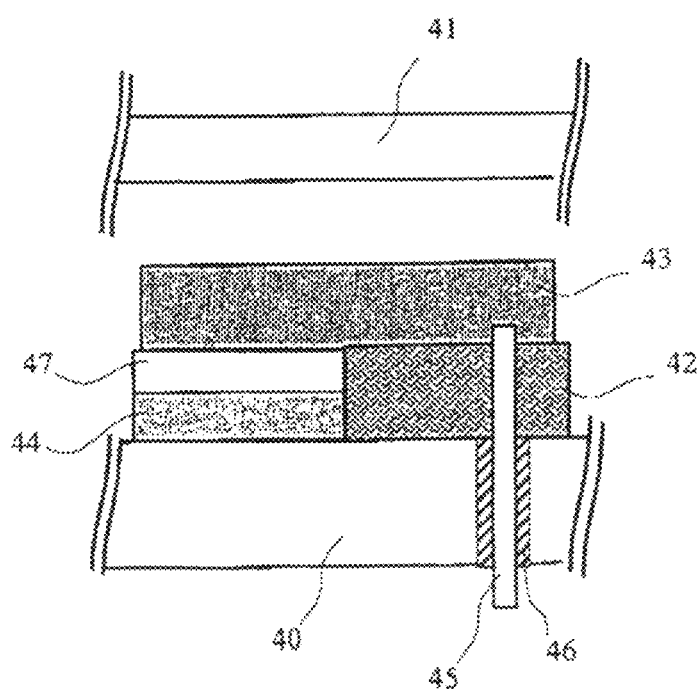

In FIG. 1 the electrical feedthrough 15 is electrically insulated from the metal substrate 10 by the electrical insulation 16. The electrical insulating layer 12 does provide the electrical insulation between the current supply layer 13 and the metal substrate 10. The electrical feedthrough 15 does provide the electrical connection to the top electrode 17 via the current supply layer 13. The top electrode 17 must be transparent at least in the spectral region where the stack of organic layers 14 does emit light. Preferentially the top electrode 17 comprises a thin metal layer, a TCO such as ITO or IZO, or also a IMI stack. Obviously the current supply layer 13 and the top electrode 17 can be formed by the same layer as shown in FIG. 4 layer 43, this can be done if the current layer 43 is conductive and transparent enough.

Still on FIG. 1, the bottom electrode 18 is a conductive layer which is deposited over the metal substrate 10, in this embodiment, the metal substrate 10 is used to supply current to the bottom electrode 18. The bottom electrode 18 is preferentially highly reflective in the spectral region of the emission of the stack of organic layers 14. The bottom electrode 18 can also have a function to smooth the roughness of the metal substrate. Alternatively the bottom electrode 18 can be left out and the area of the metal substrate 10 which contacts the stack of organic layers 14 forms the bottom electrode, in this case it is desired that the stack of organic layers 14 comprises a transport layer, preferentially a doped transport layer, which is thicker than 50 nm, more preferentially a doped transport layer which is thicker than 80 nm.

The current supply layer 13 and the top electrode 17 are electrically insulated from the bottom electrode 18 and from the metal substrate 10. This insulation can be provided by the insulating layer 12, by an extension of the stack of organic layers 14, or by an overlap of the insulating layer 12 and the stack of organic layers 14.

The at least one electrical feedthrough 15 and the electrical insulation 16 of the feedthrough is described below in combination with the FIG. 7 to FIG. 12.

Figure 2:
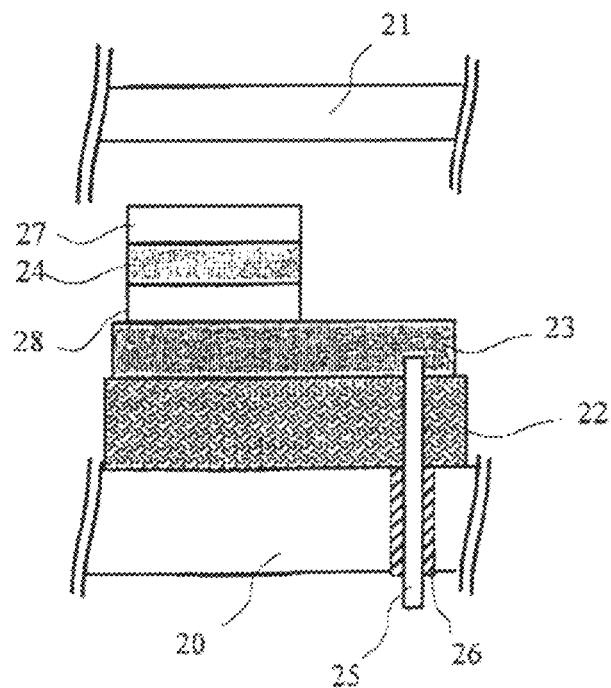

FIG. 2 is a cross sectional view of an organic light emitting device where the bottom electrode 28 of the light emitting region is completely electrically isolated from the metal substrate 10 and is electrically connected to the current supply layer 23 and to the electrical feedthrough 25. This device can be encapsulated the same way as explained in FIG. 1.

In FIG. 2, the electrically insulating layer 22 can cover the whole surface of the metal substrate, to avoid patterning. However patterning can be used such that the encapsulation is made by a direct contact (optionally using a glue or sealant) of the encapsulation 21 with the metal substrate 20, in such a way that the mechanical connection region of the encapsulation (between cover 21 and substrate 20) is provided without the electrically insulating layer 22.

In FIG. 2, the current supply layer 23 is deposited over the electrically insulating layer 22. The current supply layer 23 is in direct and electrical contact to the bottom electrode 28. The current supply layer 23 is preferentially a metal or another highly conductive layer, such as PEDOT-PSS. Optionally the current supply layer 23 also forms the bottom electrode 28, in this case an additional layer 28 is not necessary, in which case it is preferred that the current supply layer 23 is highly reflective. The top electrode 27 is connected to an additional current supply layer (e.g. as in FIG. 1). The stack of organic layers 24 is provided between the top and bottom electrodes.

FIG. 2 shows only one section of the device, which device may comprise more than one light emitting region.

The at least one electrical feedthrough 25 and the electrical insulation 26 of the feedthrough is described below in combination with the FIG. 7 to FIG. 12.

Figure 3:
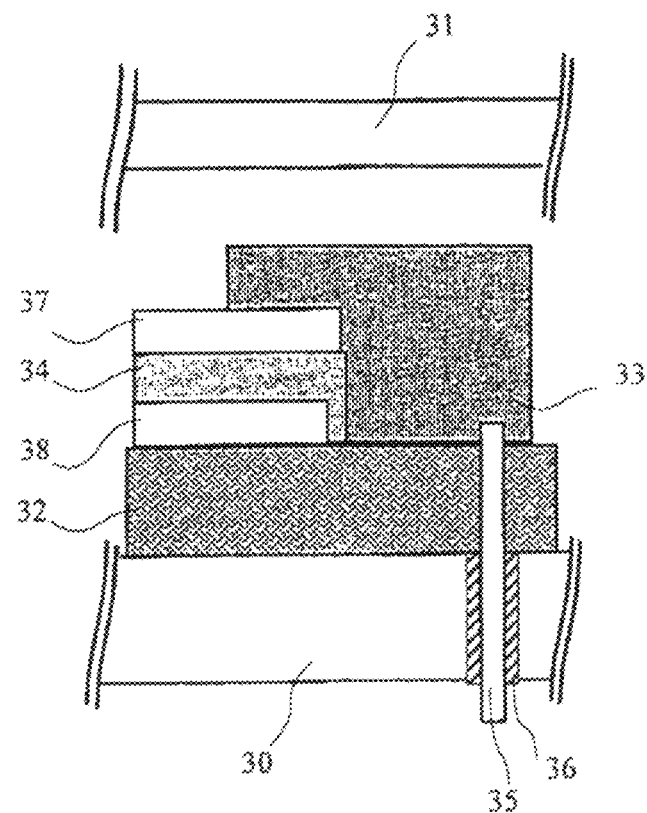

Another embodiment is shown in FIG. 3. The metal substrate 30 is coated with the electrical insulating layer 32, as described for FIG. 2. In FIG. 3, the current supply layer 33 is electrically connected to the top electrode 37. The stack of organic layers 34 is optionally used to avoid the contact between the bottom electrode 28 and the current supply layer 33. The bottom electrode 38 can be connected to a second current supply layer, e.g. the layer 23 in FIG. 2. Alternatively the bottom electrode 38 can be electrically connected to the metal substrate 30 via openings in the electrical insulating layer 32, which openings do not overlap with the light emitting layer. The encapsulation is optionally made as described above in. FIG. 1 and FIG. 2.

The at least one electrical feedthrough 35 and the electrical insulation 36 of the feedthrough is described below in combination with the FIG. 7 to FIG. 12.

FIG. 4 shows a cross sectional view of an organic light emitting device where the top electrode 47 is electrically connected to the current supply layer 43 and the bottom electrode is formed by the metal substrate 40. In this embodiment the current supply layer 43 can completely overlap the top electrode 47, in which case the current supply layer must be transparent. Alternatively the current supply layer 43 can be patterned in such a way that it does not completely covers the top electrode 47, e.g. the region of the current supply layer 43 which overlaps the top electrode 47 can be formed as a metal grid. Alternatively the top electrode 47 and the current supply layer 43 are formed by the same material, preferentially by the same layer. In another embodiment, the current supply layer 43 is not transparent and it does not completely overlap the top electrode 47, providing only sufficient overlap to create a good electrical contact.

FIG. 4 also shows that the electrical insulating layer 42 is patterned in such a way that the metal substrate contacts the stack of organic layer 44, forming the bottom electrode. The encapsulation 41 is preferentially made as described in FIG. 1 and FIG. 2.

The at least one electrical feedthrough 45 and the electrical insulation 46 of the feedthrough is described below in combination with the FIG. 7 to FIG. 12.

Figure 5:
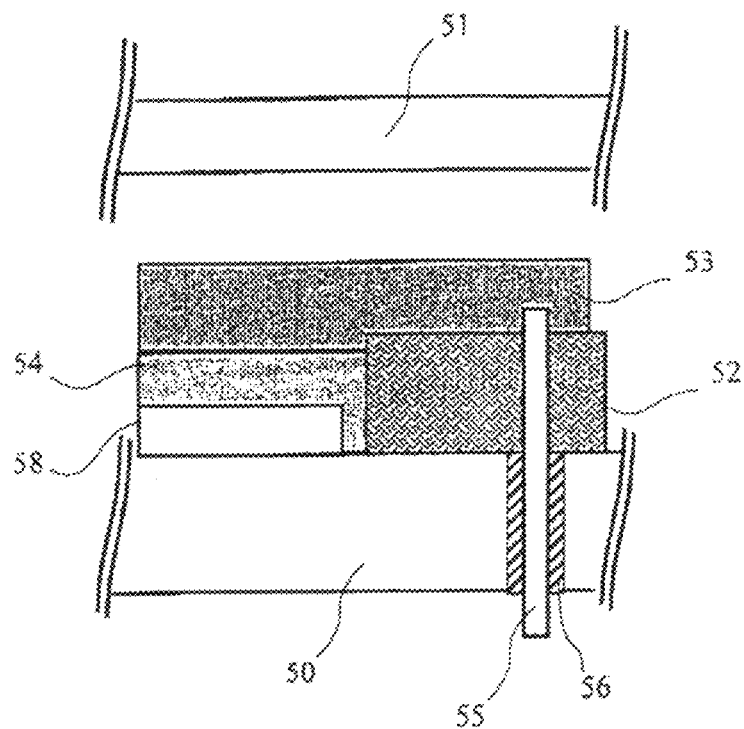

FIG. 5 shows a cross sectional view of an organic light emitting device where the top electrode is formed by current supply layer 53 and where the bottom electrode 58 is a conductive layer in electrical contact to the metal substrate 50. The stack of organic layers 53 may be also in direct and electrical contact to the metal substrate 50.

Alternatively to FIG. 1 and FIG. 5, the layer, which also forms the bottom electrode (18, 58) covers a larger area of the metal substrate (10,50), and is optionally formed between the metal substrate (10,50) and the electrically insulating layer (12,52), in this case the bottom electrode is define in the light emitting region, which is the overlap between the layer (18, 58), the top electrode (17,53) and the stack of organic layers (14,54).

The at least one electrical feedthrough 55 and the electrical insulation 56 of the feedthrough is described below in combination with the FIG. 7 to FIG. 12. Note that, as in the other embodiments, the encapsulation 51 can be a transparent rigid cover, or it can also be a thin film encapsulation, which is in direct contact to the layers on the substrate.

Figure 6:
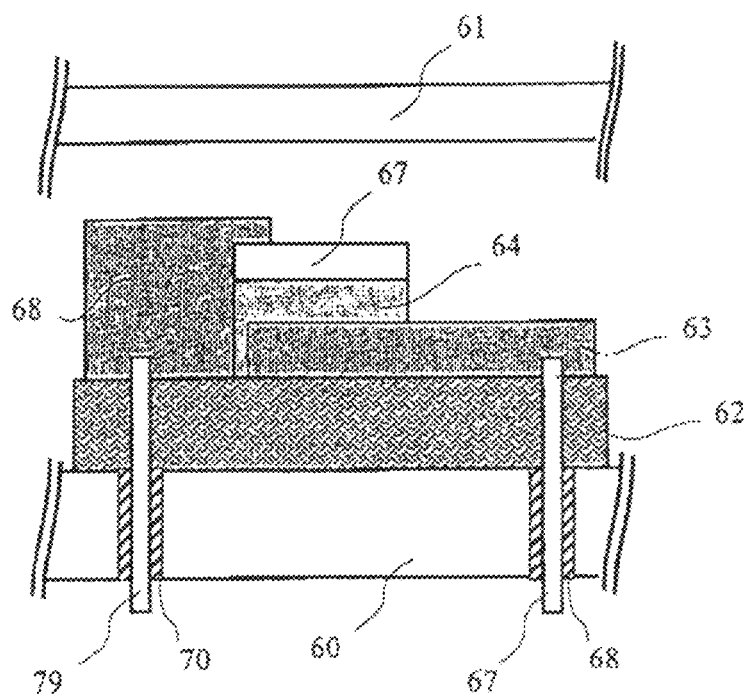

FIG. 6 shows a cross sectional view of one of the possible configurations of an organic light emitting device comprising two electrical feedthroughs (69 and 67), a first electrical feedthrough 67 electrically connected to the current supply layer 63 which current supply layer also forms the bottom electrode and a second electrical feedthrough 69 electrically connected to the top electrode 67 through the current supply layer 68.

In this embodiment of FIG. 6, the electrical connection to the light emitting regions is completely electrically insulated from the metal substrate 60, the insulation is provided by the electrically insulating layer 62 and the electrical insulation 70 and 68 of the first and second electrical feedthroughs (79 and 67). The electrically insulating layer 62 is optionally formed as described in FIG. 2 for the layer 22. The encapsulation 61 is preferentially made as described in FIG. 1 and FIG. 2. Obviously many modifications can be made, for example the layer forming the top electrode 67 can be the same layer which forms the current supply layer 68. FIG. 6 also shows only one light emitting region 64, for didactic purposes, however it is clear that several light emitting regions can be connected in parallel or in series. Also one or more sets of series connected light emitting regions can be connected (controlled) independently or in parallel.

The at least two electrical feedthroughs (69 and 67) and their electrical insulation (70 and 68) are described below in combination with the FIG. 7 to FIG. 12.

Electrical Feedthrough

The electrical feedthrough used in the present invention comprises electrical and/or mechanical functions. Several different possible embodiments for the electrical feedthrough and its electrical insulation to the metal substrate are explained in combination with the FIGS. 7 to 12.

Figure 7:
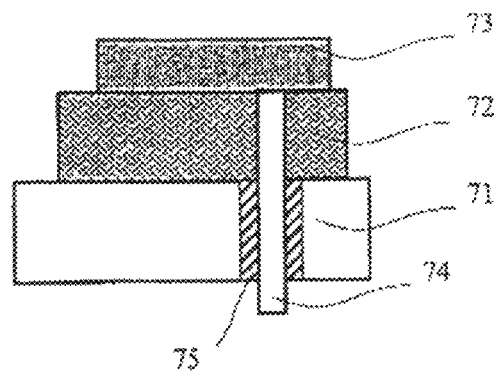

FIG. 7 shows a cross sectional view of an electrical feedthrough 74 comprising an electrical insulation (75) to the metal substrate (71) and a blind connection to the current supply layer 73. The electrically insulating layer 72 insulates the metal substrate 71 from the current supply layer 73, and can extend beyond the metal substrate 71/feedthrough 74 interface.

Figure 8:
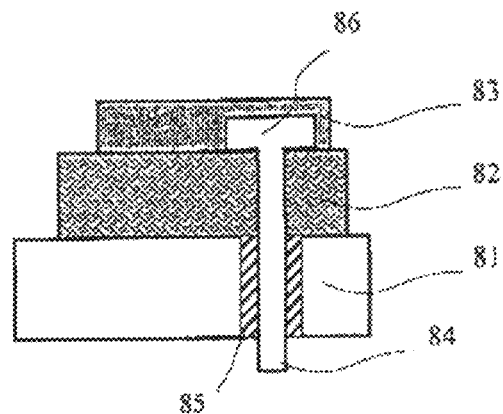

FIG. 8 shows a cross sectional view of an electrical feedthrough 84 comprising an electrical insulation (85) to the metal substrate (81), where the electrical feedthrough 84 has a head 86. The current supply layer (83) is formed over (covering) the head 86. The electrically insulating layer 82 insulates the metal substrate 81 from the current supply layer 83.

The end connection of the at least one electrical feedthrough, which end is on the side of the substrate opposite to the stack of organic layers, is optionally blind (especially in FIG. 1 to 10), meaning that it do not have the protuberance as shown in the figure. In this case, it is preferred that the metal substrate has an additional electrically insulating layer on the side of the substrate opposite to the stack of organic layers.

Figure 9:
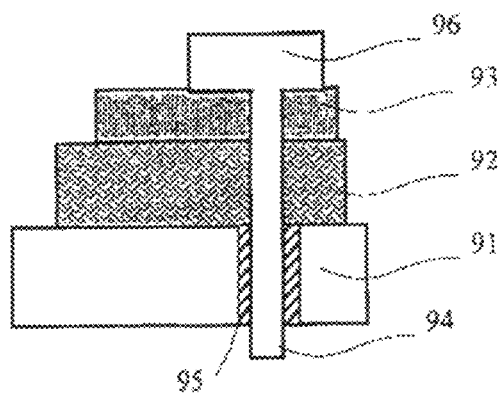

FIG. 9 shows a cross sectional view of an electrical feedthrough 94 having a larger head 96 which head 96 provides the electrical connection to the current supply layer 93. In this embodiment the current supply layer 93 is formed under the feedthrough's head 96. The at least one electrical feedthrough 94 has an electrical insulation 95 which electrically insulates the at least one electrical feedthrough 94 from the metal substrate 91. The electrically insulating layer 92 insulates the metal substrate 91 from the current supply layer 93. Alternatively the head 96 comprises at least one, preferentially 2 spring contacts, which spring contact provides the electrical contact between the feedthrough and the current supply layer 93. Another alternative is there is an additional insulation (e.g. a ring or a washer) between the head 96 and the supply layer 93, in which case the head 96 is larger than the additional insulation and bends over the additional insulation providing the electrical contact.

Optionally the head (86, 96) in FIGS. 8 and 9 also provides the mechanical a connection to the substrate.

Figure 10:
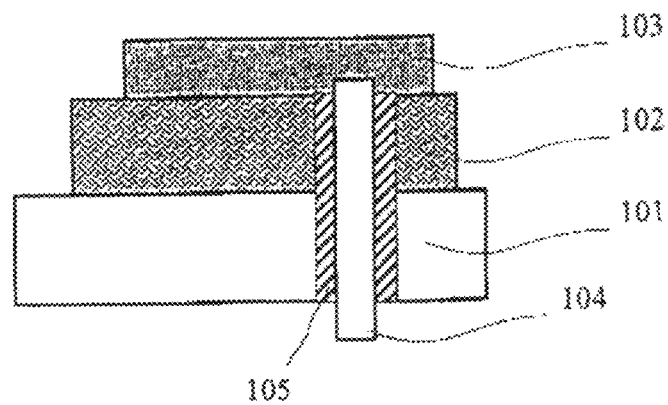

FIG. 10 shows a cross sectional view of an electrical feedthrough 104 in form of a pin comprising an electrical insulation 105 around it; the electrical insulation 105 of the feedthrough goes beyond the interface with the metal substrate 101, also being provided between the electrical feedthrough 104 and the electrically insulating layer 102, but not provided between the electrical feedthrough 104 and the current supply layer 103. The electrical feedthrough does not need to have a pin format, it can have any other desire format, as long as it fulfils its function.

Figure 11:
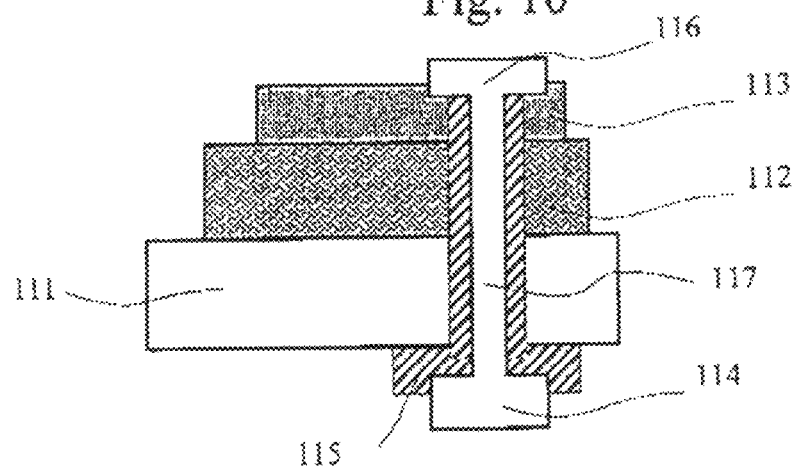

FIG. 11 represents a cross sectional view of an electrical feedthrough 117 comprising an electrical insulation 115 around it; the electrical insulation also insulates the external head 114 from the metal substrate 111. The electrically insulation of the electrical feedthrough is optionally also provided between the electrical feedthrough 117 and the metal substrate 111, and also optionally partially between the electrical feedthrough 117 the current supply layer 113. The two optional head 114 and 116 provide mechanical stability to the electrical feedthrough 117. The insulation between the head 114 and the metal substrate 111 provides electrical insulation and optionally mechanical connection. The electrically insulating layer 112 insulates the metal substrate 111 from the current supply layer 113.

Figure 12:
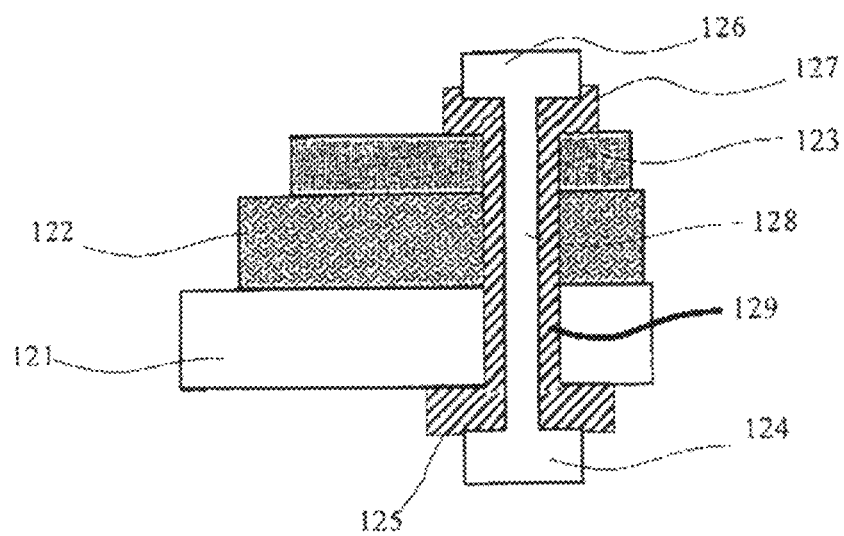

FIG. 12 shows a cross sectional view of a feedthrough for mechanical support; the feedthrough being electrically insulated from the metal substrate, from the current supply layer, and from both electrodes of the at least one light emitting region.

FIG. 12 shows a feedthrough 128 insulated from the metal substrate 121 by the electrical insulation 129, the electrical insulation 129 comprising two excess 125 and 127, where there is no electrical connection between the feedthrough 128 and the current supply layer 123. The heads 124 and 126, and the two excess 125 and 127 provide mechanical support for the feedthrough. The feedthrough can optionally be electrically connected to the current supply layer via a wire bonding from the head 126 to the current supply layer 123. This feedthrough optionally works as a mechanical spacer between the metal substrate and the rigid board (e.g. PCB) not shown. The electrically insulating layer 122 is optional.

The feedthrough can be used to provide electrical connection between a PCB and the metal substrate, in this case the electrical insulation between the feedthrough and the metal substrate is removed but there is no electrical connection between the feedthrough and the current supply layer.

Figure 13:
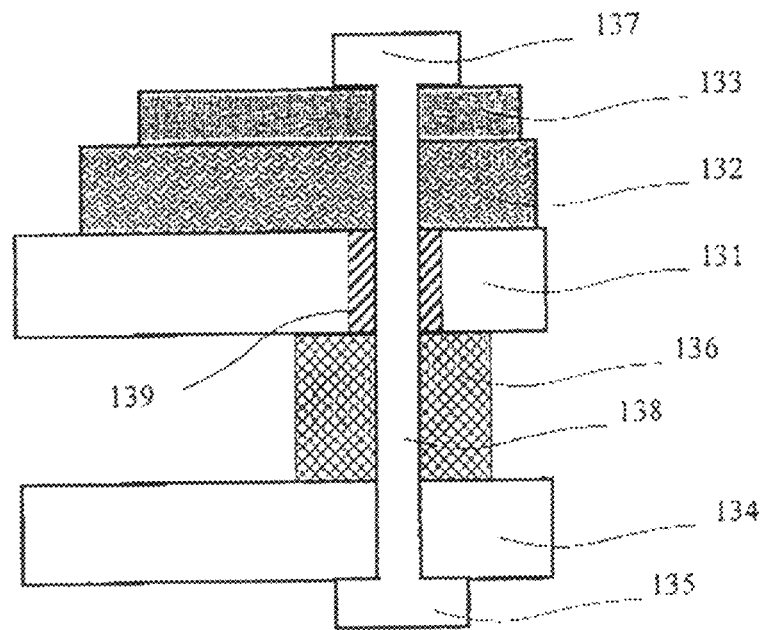

FIG. 13 shows an electrical feedthrough 138 providing mechanical connection via 2 heads (137 and 135). The head 135 is optionally soldered or welded to the rigid board. The head 135 is optional and can be substituted by directly soldering (or welding) the end of the feedthrough to the rigid board 134 (e.g. PCB). The optional mechanical spacer 136 is used to mechanically separate the rigid board 134 (e.g. PCB) from the metal substrate 131. The electrically insulating layer 132 insulates the metal substrate 131 from the current supply layer 133 which current supply layer is electrically connected to the electrical feedthrough 135. The electrical feedthrough 138 is insulated from the metal substrate 131 by the electrical insulation 139.

Figure 14:
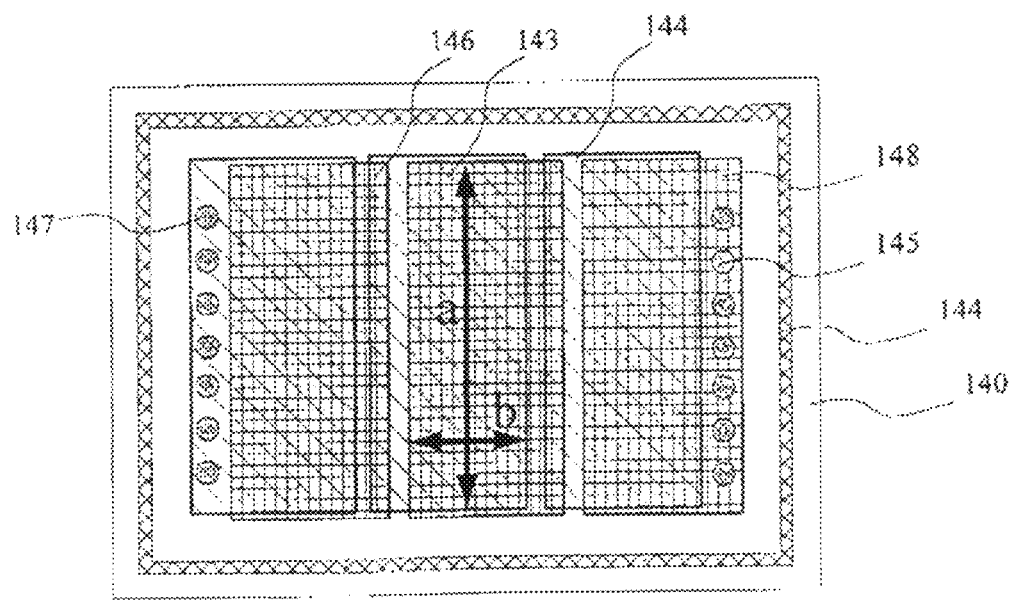

FIG. 14. is a top view of an organic light emitting device with 3 in series connected light emitting regions. One exemplary light emitting region is the region 143 which comprises a dimension "a" which is geometrically orthogonal to the dimension "b", the light emitting region 143 is defined by the overlap of the top and the bottom electrode (shown by "a" and "b") (the stack of organic layers has a larger area than the overlap). Top and bottom electrode are connected in series by their extensions as current supply layer and they overlap outside of the light emitting region 146 (146 is without the stack of organic layers). From right to left the first current supply layer 148 is the same layer which forms the bottom electrode; the current supply layer is electrically connected to the plurality of electrical feedthroughs 145. The most right, light emitting region is formed by the overlap of layers 148 and 144 (with the stack of organic layer in between). The second electrical connection to the set of light emitting regions is formed by the plurality of electrical feedthroughs 147.

In the embodiment of FIG. 14, there are no electrical connections passing between the sealing region (between substrate and encapsulation). The sealing region 144 seals and mechanically connects the rigid glass encapsulation to the metal substrate 140. The metal substrate and the glass encapsulation optionally have the same dimension (overlapping area).

Alternatively, the embodiment in FIG. 14 has a thin film encapsulation and the sealing region 144 defines a closed surface (area) which is encapsulated.

EXAMPLES

Non-limiting examples of metal substrates are stainless steel, austenitic stainless steel, martensitic stainless steel, steel according to DIN 1623, Aluminum alloy, 6063 Aluminum alloy, Aluminum plates, steel plates from Arcelor Mittal.

Examples of Stack of Organic Layers 1

The stack of organic layers comprises the following layers: 50 nm thick NPD layer doped with F4TCNQ; 10 nm thick non-doped NPD layer; 20 nm blue emitter host layer doped with a fluorescent emitter; 10 nm BPhen; 60 nm BPhen doped with Cs;

Examples of Stack of Organic Layers 2

The stack of organic layers comprises the following layer sequence: 150 nm thick NPD layer p-doped with 4 mol % of 1,3,4,5,7,8-Hexafluoronaphto-2,6-chinontetracyanomethane as hole transport layer; 10 nm thick NPD (N,N-Bis(naphthalen-1-yl)-N,N'-bis(phenyl)-benzidine) layer as electron blocking layer; 20 nm thick Spiro-DPVBi (2,2,7,7-tetrakis(2,2-diphenylvinyl)spiro-9,9-bifluorene); 10 nm 2,4,7,9-tetraphenyl-1,10-phenanthroline; 25 nm 2,4,7,9-tetraphenyl-1,10-phenanthroline n-doped with 8 mol % of Tetrakis(1,3,4,6,7,8-Hexahydro-2H-pyrimido[1,2-a]pyrimidinato)ditungsten (II); 20 nm thick NPD layer p-doped with 4 mol % of 1,3,4,5,7,8-Hexafluoronaphto-2,6-chinontetracyanomethane; 10 nm TCTA (4,4',4"-Tris(carbazol-9-yl)-triphenylamine) doped with 8 mol % of the emitter dopant Irppy; 15 nm TPBI (1,3,5-Tris(1-phenyl-1H-benzimidazol-2-yl)benzene) doped with 12 mol % of the emitter dopant Irppy; 10 nm 2,4,7,9-tetraphenyl-1,10-phenanthroline; 35 nm 2,4,7,9-tetraphenyl-1,10-phenanthroline n-doped with 8 mol % of Tetrakis(1,3,4,6,7,8-Hexahydro-2H-pyrimido[1,2-a]pyrimidinato)ditungsten (II); 30 nm thick NPD layer p-doped with 4 mol % of 1,3,4,5,7,8-Hexafluoronaphto-2,6-chinontetracyanomethane; 10 nm thick NPD; 20 nm NPD doped with 10 mol % of Iridium (III) bis(2-methyldibenzo[f,h]quinoxaline) (acetylacetonate); 10 nm 2,4,7,9-tetraphenyl-1,10-phenanthroline; 70 nm of 2,4,7,9-tetraphenyl-1,10-phenanthroline n-doped with 30 mol % of Tetrakis(1,3,4,6,7,8-Hexahydro-2H-pyrimido[1,2-a]pyrimidinato)ditungsten (II).

Device Example 1

A pre-perforated, 0.8 mm thick stainless steel plate with lateral dimensions of 100 mm×100 mm was provided as metal substrate.

The metal substrate was coated with a 500 nm thick polymer layer as electrical insulating layer. The electrical insulating layer was deposited by reactive vapour deposition from a monomer composition. The polymer was deposited by spraying a liquid precursor on the device and posterior UV curing. A 200 nm Aluminium oxide layer was deposited on top with reactive sputtering.

A 300 nm Ag layer was vapour-deposited on the electrical insulating layer forming a current supply layer and the bottom electrode. The stack of organic layers as in the example "Examples of stack of organic layers 2" was deposited on top of the bottom electrode. A 20 nm Ag layer was deposited as top electrode and as current supply layer to the top electrode. The device was encapsulated with a glass cover, containing a cavity and a moisture getter material inside the cavity. Each current supply layers did overlap one different hole, through which eyelets feedthroughs were applied. The feedthroughs contacts were done as in FIG. 10. A teflon tube (insulating sleeve) was used as insulator.

Device Example 2

A pre-perforated, 0.8 mm thick stainless steel plate with lateral dimensions of 100 mm×100 mm was provided as metal substrate.

The metal layer was coated with a cross-linkable polymer insulating layer.

The metal substrate was additionally coated with a 2.0 μm thick photodefineable polyimide layer (HD-8820 from HD microsystems) was deposited on a metal substrate by spin coating at 3500 rpm.

The polyimide layer is heated at 120° C. for 3 minutes; the pattern was defined by exposing to a light pattern for 50 seconds.

The feedthroughs were provided after the coating with insulating layer and before the coating of the bottom electrode. The feedthrough in this example was a copper cylinder (copper wire, diameter of 3 mm) with a bold and flat end (head), the electrical insulation of the feedthrough was provided by a heat-shrinkable sleeve. A 500 nm Ag layer was deposited by spin coating of a colloidal silver solution.

The polyimide layer was developed for 120 seconds. The silver layer was patterned by lift-off forming two regions A and B. The substrate was heated at 180° C. for half an hour, drying the polyimide layer and curing the colloidal silver layer.

With these steps, two conductive Ag regions were provided, one forming the bottom electrode, the current supply layer to the bottom electrode, and the electrical connection to the feedthrough. The other region was forming the current supply layer of the top electrode. Both regions were connected to their respective feedthroughs.

The stack of organic layers as in the example "Examples of stack of organic layers 2" was deposited on top of the bottom electrode. A 20 nm Ag layer was deposited as top electrode and an extension of this layer overlapped the current supply layer to the top electrode. An 80 nm thick ITO layer was sputtered on top of the Ag layer as a conductive reinforcement. A thin film encapsulation was deposited covering all the layers expect for the extensions of the electrical connections. The thin film encapsulation consists of a triple sequence of 250 nm of polymer and 50 nm of Aluminium oxide. The polymer is deposited by spraying a liquid precursor on the device and posterior UV curing. The Aluminium oxide is deposited by DC reactive sputtering.

Device Example 3

A pre-perforated, 0.8 mm thick stainless steel plate with lateral dimensions of 100 mm×100 mm was provided as metal substrate.

The metal substrate was coated with an electrical insulating layer consisting of a 2.0 μm thick photodefineable polyimide layer (HD-8820 from HD microsystems) deposited on a metal substrate by spin coating at 3500 rpm.

The polyimide layer is heated at 120° C. for 3 minutes; the pattern is defined by exposing to a light pattern for 50 seconds, developed for 120 seconds and heated at 180° C. for half an hour. The insulating film was patterned to expose the substrate in areas of 10 mm×10 mm.

A patterned Ag film, with thickness of 300 nm was deposited on the exposed areas of the substrate, forming the bottom electrode.

The stack of organic layers as in the example "Examples of stack of organic layers 1" was deposited on top of the bottom electrode areas. A top electrode and current supply layer of 20 nm Ag was deposited on top of the organic layers and also in contact with the electrical insulating layer.

The device was encapsulated with a glass cover, containing a cavity and a getter material inside the cavity.

A set of rivets was installed to the device, in electrical connection to the current supply layer of the top electrode, forming the electrical feedthroughs (similar to FIG. 9, with the head connecting to the current supply layer). The electrical connection to each OLED is provided by the metal substrate and by the electrical feedthroughs.

Device Example 4

Device of example 3 was repeated, with the following modifications:

Additional rivets were fixed to the substrate creating an electrical connection to the substrate. The additional rivets and the rivets forming the electrical feedthroughs had an elongation. The elongations of the rivets were fixed by soldering they to a PCB containing driving electronics.

A mechanical separation between the metal substrate and PCB was provided by a plastic ring used on the rivets, like the spacer 136 in FIG. 13. However the spacer is not really necessary if the PCB is monolayer, with the conducting layer facing away from the metal substrate.

Device Example 5

A pre-perforated, 0.8 mm thick stainless steel plate with lateral dimensions of 100 mm×100 mm was provided as metal substrate. The metal substrate was coated with an electrical insulating layer consisting of a 2.3 μm thick polyimide layer (PI2555 from HD microsystems) deposited by spin coating at 3500 rpm and heated at 180° C. for half an hour.

A patterned Ag film, with thickness of 300 nm was deposited on the exposed areas of the substrate, forming the bottom electrodes and individual current supply layers to the bottom electrodes.

The stack of organic layers as in the example "Examples of stack of organic layers 1" was deposited on top of the bottom electrode (as in layer 64 of FIG. 6). A top electrode of 100 nm ITO was deposited on top of the organic layers (as in layer 67 of FIG. 6). A current supply layer of 40 nm Ag was deposited partially overlapping the top electrode (as in layer 68 on FIG. 6). Button rivets were used to provide the feedthroughs to the bottom and top current supply layers. The button rivets were isolated from the metal substrate by a plastic cylinder. The complete device was encapsulated with a thin film encapsulation as in example 2.

Device Example 6

A pre-perforated (refer to 147 in FIG. 14), 0.8 mm thick stainless steel plate with lateral dimensions of 100 mm×100 mm was provided as metal substrate. The metal substrate was coated with an electrical insulating layer consisting of a 2.3 μm thick polyimide layer (PI2555 from HD microsystems) deposited by spin coating at 3500 rpm and heated at 180° C. for half an hour.

500 nm Ag (bottom Ag layer) was deposited on top of the electrical insulating layer forming 3 areas, each with a lateral dimension of 25 mm×65 mm, with a space of 2 mm between the layers (refer to 144 in FIG. 14). A stack of organic layers as in the example "Examples of stack of organic layers 2" was deposited on top of the Ag layers (bottom electrodes). The stack of organic layers was patterned in such a way to keep part of the bottom electrodes exposed.

20 nm Ag/60 nm ITO (top Ag layer) was deposited on top (refer to 148 in FIG. 14) of the stack of organic layers and partially overlapping the bottom Ag layer, forming the top electrodes and a series connection (refer to 146 in FIG. 14).

The device was encapsulated with a glass cover, containing a cavity and a moisture getter material inside the cavity (See glue region 144 in FIG. 14).

The extensions of the bottom Ag layer and of the top Ag layer formed the current supply layers, which were connected to the feedthroughs (145, 147).

Device Example 7

The device was fabricated as in example 6 with the following modifications:

The metal substrate was not pre-perforated. The extensions of the bottom Ag layer and of the top Ag layer formed the current supply layers extended through the outside of encapsulate region. After the encapsulation, holes where made to the substrate (outside of the encapsulated region), metal screws were provided through these holes. The screws were electrically insulated from the substrate. Each screw comprised a head with spring contacts (spring contact test probes from Connect2it, LLC), which was used to provide electrical contact between the screw and the respective current supply layer. At the other side of the substrate (opposite to the current supply layer), a nut was used to fix the screw, and plastic washer was used to electrically insulate the nut from the metal substrate.

The advantages of such a construction, is that the electrically connections provide by the screws are mechanically very robust.

The features disclosed in at least one of the specification, the claims, and the figures may be material for the realization of the invention in its various embodiments, taken in isolation or in various combinations thereof.

The invention claimed is:

1. An organic light emitting device comprising:
   an electrode,
   a counter electrode,
   at least one light emitting region comprising a stack of organic layers arranged between a metal substrate and a transparent encapsulation, wherein the stack of organic layers, the metal substrate, and the transparent encapsulation are arranged between the electrode and the counter electrode,
   a current supply layer that is electrically connected to the electrode or the counter-electrode, and overlaps an electric insulating layer that is in direct contact with the metal substrate, and
   at least one electrical feedthrough through the metal substrate and through the electric insulating layer, wherein the electrical feedthrough provides an electrical connection to the current supply layer and is electrically isolated from the metal substrate.

2. The organic light emitting device according to claim 1, wherein the device comprises at least two light emitting regions, each of the light emitting regions comprising a stack of organic layers, wherein the light emitting regions are electrically connected in parallel, wherein an overlapping area of the electrode and the counter-electrode defines a light emitting region.

3. The organic light emitting device according to claim 1, wherein the light emitting region defined by an overlapping area of the electrode and counter-electrode comprises a first dimension of at least 5 mm and a second dimension that is orthogonal to the first dimension of at least 5 cm.

4. The organic light emitting device according to claim 1, wherein the device comprises at least two light emitting regions, each of the light emitting regions comprising a stack of organic layers, wherein the at least two light emitting regions are electrically connected in series.

5. The organic light emitting device according to claim 1, further comprising a first set of at least two series connected light emitting regions and a second set of at least two series connected light emitting regions, wherein the first and the second sets of series connected light emitting region are connected in parallel.

6. The organic light emitting device according to claim 1, comprising at least two light emitting regions.

7. The organic light emitting device according to claim 1, comprising at least three light emitting regions.

8. The organic light emitting device according to claim 1, wherein the at least one electrical feedthrough is selected from the group consisting of: micro jack, binding post, screw, eyelet rivet, turret, threaded turret, rivet, and other thru hole mounts.

9. The organic light emitting device according to claim 1, comprising at least two electrical feedthroughs.

10. The organic light emitting device according to claim 1, comprising at least two electrical feedthroughs essentially aligned in parallel to at least one of the borders of the at least one light emitting region, wherein the at least two electrical feedthroughs are spaced apart by at least 5 mm.

11. The organic light emitting device according to claim 10, comprising at least two electrical feedthroughs essentially aligned in parallel to at least one of the borders of the at least one light emitting region, wherein the at least two electrical feedthroughs are spaced apart by not more than 50 mm.

12. The organic light emitting device according to claim 1, comprising at least a second electrical feedthrough and an essentially rigid board arranged on the substrate side which is opposite to the encapsulation, wherein the at least one electrical feedthrough and the at least second electrical feedthrough provide a mechanical connection to the essentially rigid board.

13. The organic light emitting device according to claim 12, wherein the essentially rigid board is a PCB (printed circuit board).

14. The organic light emitting device according to claim 13, wherein the PCB comprises an electronic driver circuit which provides the electrical power for the organic light emitting device, wherein the driver circuit comprises a first side and a second side, the first side having higher voltage and lower current than the second side, and the second side having lower voltage and higher current than the first side.

15. The organic light emitting device according to claim 14, wherein the second side is electrically connected to the at least one electrical feedthrough.

* * * * *